United States Patent
Wu et al.

(10) Patent No.: US 10,879,373 B2
(45) Date of Patent: Dec. 29, 2020

(54) STRUCTURE AND FORMATION METHOD OF SEMICONDUCTOR DEVICE WITH METAL GATE STACK

(71) Applicant: Taiwan Semiconductor Manufacturing Co., Ltd., Hsinchu (TW)

(72) Inventors: Xusheng Wu, Hsinchu (TW); Chang-Miao Liu, Hsinchu (TW); Huiling Shang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/392,130

(22) Filed: Apr. 23, 2019

(65) Prior Publication Data
US 2020/0343362 A1    Oct. 29, 2020

(51) Int. Cl.
| | | |
|---|---|---|
| *H01L 21/82* | (2006.01) | |
| *H01L 29/66* | (2006.01) | |
| *H01L 29/423* | (2006.01) | |
| *H01L 21/8234* | (2006.01) | |
| *H01L 21/28* | (2006.01) | |
| *H01L 29/78* | (2006.01) | |
| *H01L 27/088* | (2006.01) | |
| *H01L 29/49* | (2006.01) | |

(52) U.S. Cl.
CPC .. *H01L 29/66545* (2013.01); *H01L 21/28008* (2013.01); *H01L 21/823418* (2013.01); *H01L 21/823431* (2013.01); *H01L 21/823437* (2013.01); *H01L 21/823468* (2013.01); *H01L 27/0886* (2013.01); *H01L 29/4236* (2013.01); *H01L 29/49* (2013.01); *H01L 29/6653* (2013.01); *H01L 29/66795* (2013.01); *H01L 29/785* (2013.01)

(58) Field of Classification Search
None
See application file for complete search history.

(56) References Cited

U.S. PATENT DOCUMENTS 6,355,581 B1 *   3/2002   Vassiliev ........... H01L 21/02211
                                            438/789
6,720,213 B1 *   4/2004   Gambino .......... H01L 21/26506
                                            438/184

(Continued)

*Primary Examiner* — Benjamin P Sandvick
(74) *Attorney, Agent, or Firm* — Birch, Stewart, Kolasch & Birch, LLP

(57) ABSTRACT

A structure and a formation method of a semiconductor device are provided. The method includes forming a dummy gate stack over a semiconductor substrate. The dummy gate stack has a dummy gate electrode and a dummy gate dielectric layer. The method also includes forming spacer elements over sidewalls of the dummy gate stack and partially removing the dummy gate electrode to form a recess. The method further includes partially removing the spacer elements to enlarge the recess and removing a remaining portion of the dummy gate electrode to expose the dummy gate dielectric layer. In addition, the method includes doping the spacer elements after the remaining portion of the dummy gate electrode is removed and removing the dummy gate dielectric layer. The method further includes forming a metal gate stack in the recess.

20 Claims, 8 Drawing Sheets

(56) References Cited

U.S. PATENT DOCUMENTS

| | | | | |
|---|---|---|---|---|
| 8,592,265 | B2* | 11/2013 | Kim | H01L 21/28132 |
| | | | | 438/184 |
| 9,257,348 | B2* | 2/2016 | Xie | H01L 21/823864 |
| 2011/0073963 | A1* | 3/2011 | Beyer | H01L 29/6653 |
| | | | | 257/410 |
| 2011/0151655 | A1* | 6/2011 | Chan | H01L 21/823814 |
| | | | | 438/589 |
| 2012/0322218 | A1* | 12/2012 | Lai | H01L 29/42376 |
| | | | | 438/303 |
| 2017/0186623 | A1* | 6/2017 | Posseme | H01L 21/2236 |

* cited by examiner

STRUCTURE AND FORMATION METHOD OF SEMICONDUCTOR DEVICE WITH METAL GATE STACK

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
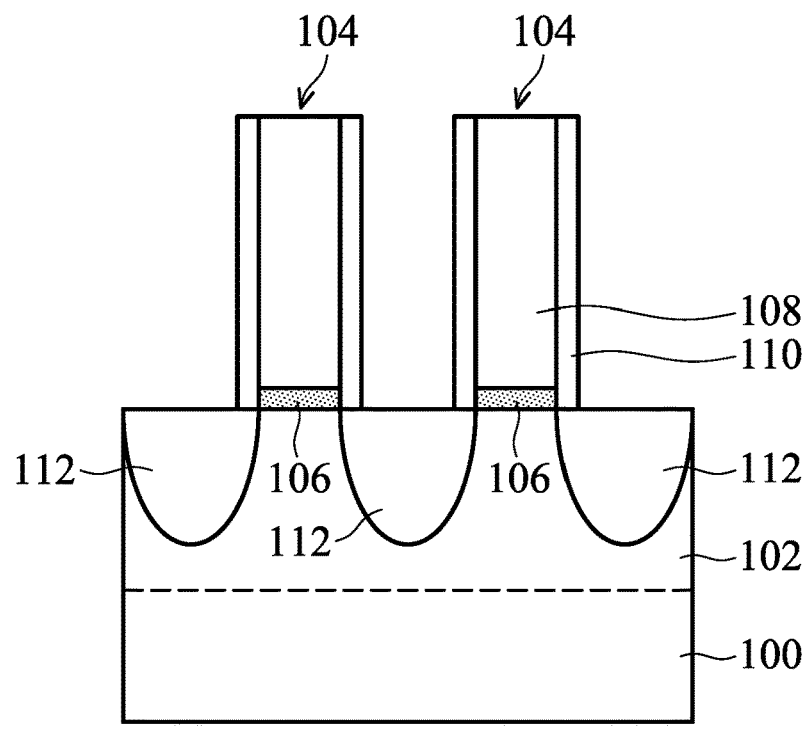
FIGS. 1A-1K are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1K are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, one or multiple fin structures are formed. As shown in FIG. 1A, one of the fin structures (the fin structure 102) is shown. In some embodiments, multiple recesses (or trenches) (not shown) are formed in the semiconductor substrate 100. As a result, multiple fin structures including the fin structure 102 are formed between the recesses. In some embodiments, one or more photolithography and etching processes are used to form the recesses.

In some embodiments, isolation features (not shown) are formed in the recesses to surround a lower portion of the fin structure 102. The isolation features are used to define and electrically isolate various device elements formed in and/or over the semiconductor substrate 100. In some embodiments, the isolation features include shallow trench isolation (STI) features, local oxidation of silicon (LOCOS) features, other suitable isolation features, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, one or more other suitable materials, or a combination thereof. In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features. In some other embodiments, the STI liner is not formed. In these cases, the isolation features may be in direct contact with the fin structures.

In some embodiments, a dielectric material layer is deposited over the semiconductor substrate 100. The dielectric material layer covers the fin structures including the fin structure 102 and fills the recesses between the fin structures. In some embodiments, the dielectric material layer is deposited using a chemical vapor deposition (CVD) process, an atomic layer deposition (ALD) process, a spin coating process, one or more other applicable processes, or a combination thereof.

In some embodiments, a planarization process is then used to thin down the dielectric material layer until the fin structure 102 (or a hard mask element on the fin structure 102) is exposed. The planarization process may include a chemical mechanical polishing (CMP) process, a grinding process, an etching process, a dry polishing process, one or more other applicable processes, or a combination thereof. Afterwards, the dielectric material layer is etched back to below the top of the fin structure 102. As a result, the isolation features are formed. The fin structures including the fin structure 102 protrude from the top surfaces of the isolation features.

As shown in FIG. 1A, gate stacks 104 are formed over the semiconductor substrate 100, in accordance with some embodiments. The gate stacks 104 cover portions of the fin structure 102. In some embodiments, each of the gate stacks 104 extends across multiple fin structures including the fin structure 102. In some embodiments, the gate stack 104 surrounds side surfaces and a top surface of the fin structure 102 and further extends over the semiconductor substrate 100. In some embodiments, the portion of the fin structure 102 under the gate stack 104 serves as a channel region of a transistor that will be formed.

In some embodiments, the gate stack 104 is a dummy gate stack and will be replaced with a new gate stack such as a metal gate stack. Each of the gate stacks 104 includes a dummy gate dielectric layer 106 and a dummy gate electrode 108, as shown in FIG. 1A.

In some embodiments, a gate dielectric material layer used for forming the dummy gate dielectric layer 106 is deposited over the semiconductor substrate 100 to cover the fin structure 102 and the isolation features between the fin structures. In some embodiments, the gate dielectric material layer is made of or includes silicon oxide. In some embodiments, the gate dielectric material layer is deposited using a thermal oxidation process, a CVD process, an ALD process, one or more other applicable processes, or a combination thereof.

Afterwards, a gate electrode layer used for forming the dummy gate electrodes 108 is formed over the gate dielectric material layer to cover a portion of the fin structure 102, as shown in FIG. 1A in accordance with some embodiments. In some embodiments, the gate electrode layer is made of a semiconductor material such as polysilicon. In some embodiments, the gate electrode layer is deposited over the gate dielectric material layer using a CVD process or one or more other applicable processes. In some embodiments, the gate electrode layer is made of polysilicon.

Afterwards, a patterned hard mask layer (not shown) is formed over the gate electrode layer, in accordance with some embodiments. The patterned hard mask layer is used to pattern the gate electrode layer into the dummy gate electrodes 108. In some embodiments, the gate dielectric material layer is also patterned to form the dummy gate dielectric layer 106, as shown in FIG. 1A.

In some embodiments, the patterned hard mask layer includes a first hard mask layer and a second hard mask layer. The first hard mask layer is between the gate electrode layer and the second hard mask layer. In some embodiments, the first hard mask layer is made of silicon nitride. In some embodiments, the second hard mask layer is made of silicon oxide. In some embodiments, the second hard mask layer is thicker than the first hard mask layer. In some embodiments, the patterned hard mask layer includes two or more material layers. In some embodiments, these material layers are made of different materials. In some embodiments, some of the material layers are made of different materials. In some other embodiments, the patterned hard mask layer includes only one single material layer.

Afterwards, spacer elements 110 are formed over sidewalls of the gate stack 104, as shown in FIG. 1A in accordance with some embodiments. The spacer elements 110 may be used to protect the gate stack 104 and/or assist in a subsequent process for forming source/drain structures. In some embodiments, the spacer elements 110 are made of one or more dielectric materials. The dielectric material(s) may include silicon nitride, silicon oxynitride, silicon oxide, one or more other suitable materials, or a combination thereof. Each of the spacer elements 110 may include a single dielectric layers. Alternatively, each of the spacer elements 110 may include multiple dielectric layers. The multiple dielectric layers may be made of different materials.

In some embodiments, a dielectric material layer is deposited over the semiconductor substrate 100 and the gate stacks 104. The dielectric material layer may be deposited using a CVD process, an ALD process, a physical vapor deposition (PVD) process, a spin coating process, one or more other applicable processes, or a combination thereof. Afterwards, the dielectric material layer is partially removed using an etching process, such as an anisotropic etching process. As a result, the remaining portions of the dielectric material layer over the sidewalls of the gate stacks 104 form the spacer elements 110.

As shown in FIG. 1A, source/drain structures 112 are formed over the portions of the fin structure 102 near the gate stack 104, in accordance with some embodiments. In some embodiments, the source/drain structures 112 are also used as stressors that can apply strain or stress on the channel region between the source/drain structures 112. The carrier mobility may be improved accordingly.

In some embodiments, the fin structure 102 is partially removed to form recesses near the spacer elements 110. In some embodiments, the recesses laterally extend so that portions of the recesses are directly below the gate stacks 104. Afterwards, an epitaxial growth process is performed to form the source/drain structures 112, as shown in FIG. 1A in accordance with some embodiments. The epitaxial growth process may include a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the source/drain structures 112 are doped with one or more suitable dopants. For example, the source/drain structures 112 are SiGe source/drain features doped with boron (B), indium (In), or another suitable dopant. Alternatively, in some other embodiments, the source/drain structures 112 are Si source/drain features doped with phosphor (P), arsenic (As), antimony (Sb), or another suitable dopant.

In some embodiments, the source/drain structures 112 are doped in-situ during their epitaxial growth. In some other embodiments, the source/drain structures 112 are not doped during the growth of the source/drain structures 112. Instead, after the formation of the source/drain structures 112, the source/drain structures 112 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the source/drain structures 112 are further exposed to one or more annealing processes to activate the dopants. For example, a rapid thermal annealing process is used.

Figure 1B:
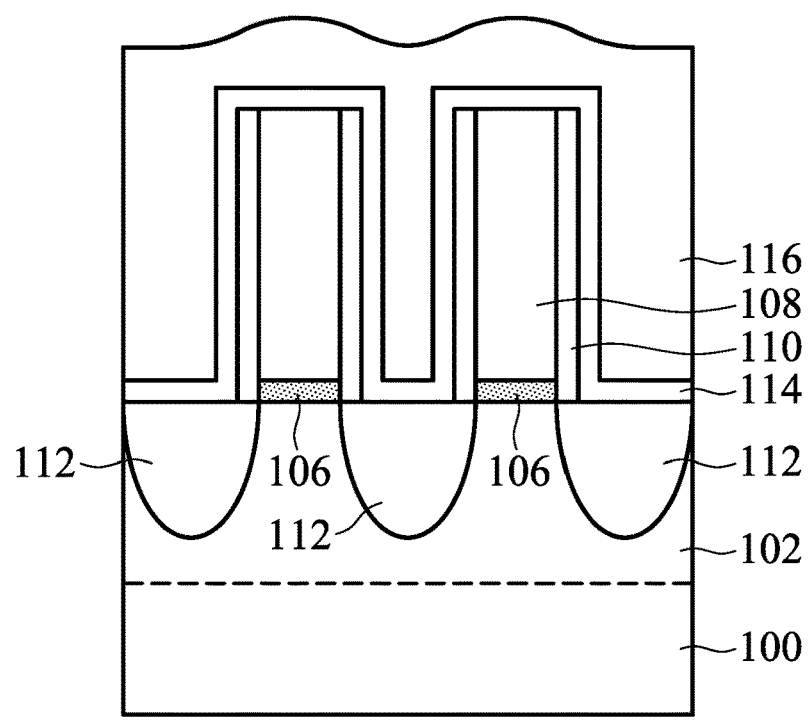

As shown in FIG. 1B, an etch stop layer 114 is deposited over the structure shown in FIG. 1A, in accordance with some embodiments. The etch stop layer 114 extends over the sidewalls and tops of the gate stacks 104. The etch stop layer 114 may be used to assist in a subsequent formation of conductive contacts to the source/drain structures 112. The etch stop layer 114 may be made of or include silicon nitride, silicon oxynitride, silicon carbide, one or more other suitable materials, or a combination thereof. The etch stop layer 114 may be deposited using a CVD process, an ALD process, a flowable chemical vapor deposition (FCVD) process, a spin coating process, one or more other applicable processes, or a combination thereof.

Afterwards, a dielectric layer 116 is deposited over the etch stop layer 114, as shown in FIG. 1B in accordance with some embodiments. The dielectric layer 116 covers the source/drain structures 112, the spacer elements 110, the fin structure 102, and the gate stacks 104.

The dielectric layer 116 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 116 is deposited using a CVD process, a FCVD process, an ALD process, a spin coating process, one or more other applicable processes, or a combination thereof.

Figure 1C:
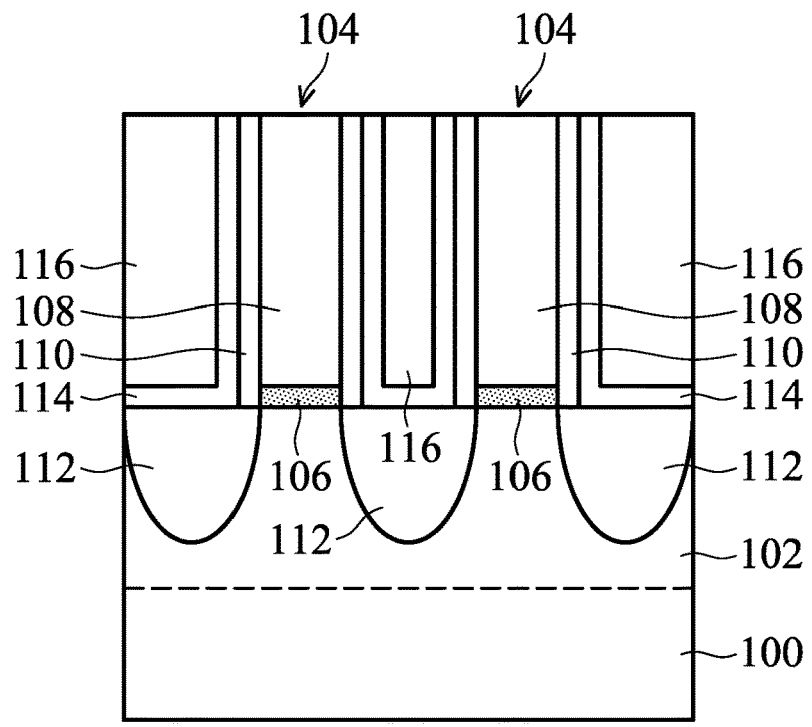

As shown in FIG. 1C, a planarization process is used to partially remove the dielectric layer 116 and the etch stop layer 114, in accordance with some embodiments. The planarization process may be performed until the dummy gate electrodes 108 are exposed. Alternatively, the planarization process may be performed until a hard mask element on the dummy gate electrodes 108 is exposed. In some embodiments, the planarization process includes a CMP process, a grinding process, an etching process, a dry polishing process, one or more other applicable processes, or a combination thereof.

Figure 1D:
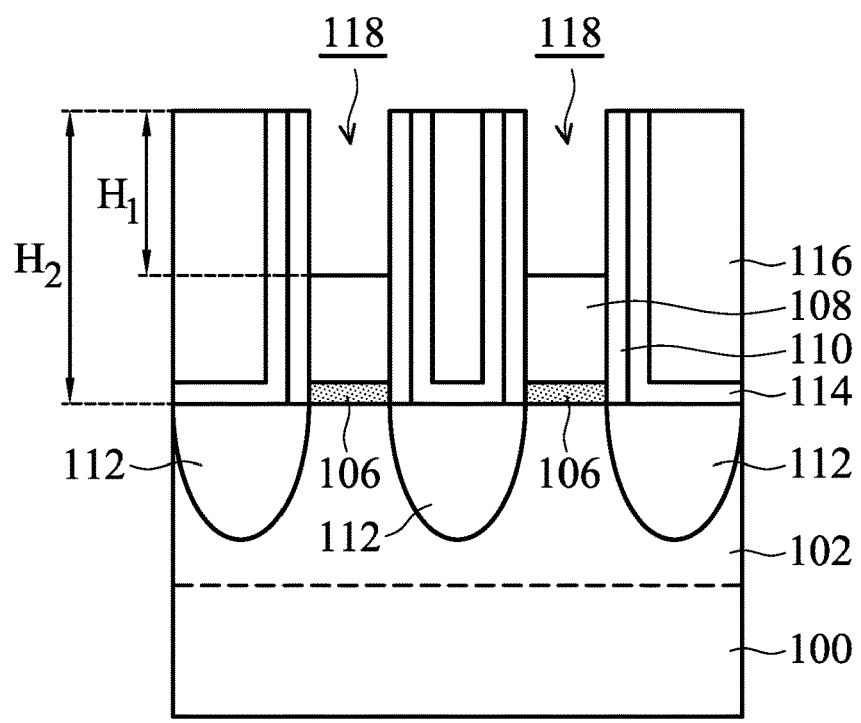

As shown in FIG. 1D, the dummy gate electrodes 108 are partially removed to form recesses 118 in a first etching operation, in accordance with some embodiments. Each of the recesses 118 is surrounded by the spacer elements 110 and the dummy gate electrodes 108 remaining between the spacer elements 110. Each of the recesses 118 has a depth $H_1$. The depth $H_1$ may be in a range from about 10 nm to about 100 nm. The depth $H_1$ may depend on the dummy gate height. Before the partial removal of the dummy gate electrodes 108, each of the gate stacks 104 has a height $H_2$, as shown in FIG. 1D. The height $H_2$ may be in a range from about 20 nm to about 200 nm. The ratio ($H_1/H_2$) of the depth $H_1$ to the height $H_2$ may be in a range from about 0.1 to about 0.95. In some other embodiments, the ratio ($H_1/H_2$) of the depth $H_1$ to the height $H_2$ may be in a range from about 1/3 to about 2/3.

In some embodiments, the first etching operation involves using plasma. In some embodiments, the reaction gas used for generating the plasma of the first etching operation includes HBr, $Cl_2$, another similar gas, one or more other suitable gases, or a combination thereof.

Figure 1E:
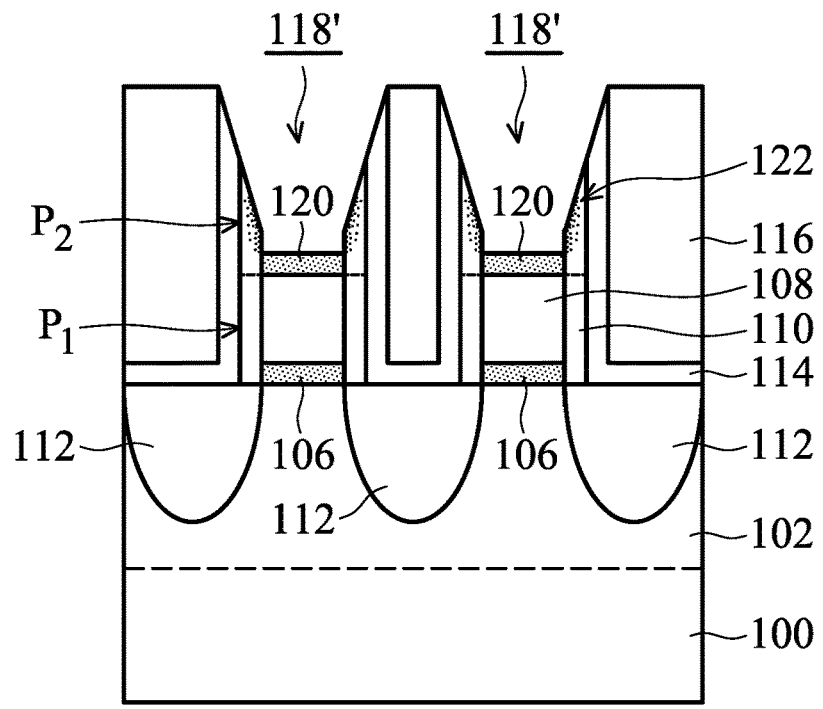

As shown in FIG. 1E, the spacer elements 110 are partially removed to enlarge the recesses 118 so that recesses 118' (that are larger) are formed, in accordance with some embodiments. The upper portions of the recesses 118' become wider than the upper portions of the recesses 118 shown in FIG. 1D.

In some embodiments, the spacer elements 110 are laterally etched in a second etching operation. In some embodiments, an etching rate of the first etching operation to the spacer elements 110 is lower than an etching rate of the second etching operation to the spacer elements 110. In some embodiments, the second etching operation is in-situ performed in the same process chamber where the first etching operation is performed without breaking vacuum.

In some embodiments, a portion of the etch stop layer 114 is also removed during the spacer elements 110 are partially removed, as shown in FIG. 1E. The second etching operation partially etches the etch stop layer 114. The recesses 118' are enlarged and extend into the etch stop layer 114.

Oxide layers 120 (such as native oxide layers) may be grown on the surface portions of the dummy gate electrodes 108 during the second etching operation or after the structure shown in FIG. 1E is taken out of the process chamber and exposed to air. Each of the oxide layers 120 may have a thickness in a range from about 0.1 nm to about 5 nm. In some other embodiments, the oxide layers 120 has a thickness that is in a range from about 1 nm to about 3 nm.

In some embodiments, the condition of the second etching operation is fine-tuned to lateral etch upper portions of the spacer elements 110, as shown in FIG. 1E. In some embodiments, the second etching operation involves using plasma. In some embodiments, the reaction gas used for generating the plasma of the second etching operation includes $CHF_3$, HBr, $O_2$, Ar, He, $N_2$, another similar gas, one or more other suitable gases, or a combination thereof. In some embodiments, a volumetric concentration of $CHF_3$ is in a range from about 5% to about 90%. In some embodiments, a volumetric concentration of HBr is in a range from about 5% to about 50%. In some embodiments, a volumetric concentration of $O_2$ is in a range from about 5% to about 50%. In some embodiments, the plasma is generated using a continuous mode. The operation power for generating the plasma may be in a range from about 200 W to about 2000 W. In some other embodiments, the plasma is generated using a pulse mode, which includes "on" state and "off" state. The operation power for generating the plasma may be in a range from about 200 W to about 800 W. For example, the operation power is about 500 W.

Due to the lateral etching of the spacer elements 110, each of the recesses 118' has a larger opening. In some embodiments, each of the recesses 118' has a slanted sidewall. In some other embodiments, each of the recesses 118' has curved sidewalls. In some embodiments, each of the recesses 118' has a width that gradually increases along a direction from the bottom of the recess 118' towards the top of the recess 118'.

In some embodiments, the second etching operation results in defect formation in the spacer elements 110. As shown in FIG. 1E, each of the spacer elements 110 has a lower portion $P_1$ and an upper portion $P_2$. In some embodiments, due to the second etching operation, defects 122 are formed in the upper portion $P_2$. Due to the protection of the remaining portions of the dummy gate electrodes 108, the lower portion $P_1$ of the spacer elements 110 may be prevented from being damaged by the second etching operation. The lower portion $P_1$ is substantially free of the defects 122 caused by the second etching operation.

In some embodiments, the defects 122 are mainly formed near a surface part of the upper portion $P_2$. In some embodiments, the density of the defects 122 gradually decreases from the inner surface of the upper portion $P_2$ towards the outer surface of the upper portion $P_2$ that is adjacent to the etch stop layer 114. In some embodiments, a portion of the upper portion $P_2$ near the etch stop layer 114 is substantially free of the defects 122 caused by the second etching operation, as shown in FIG. 1E.

Figure 1F:
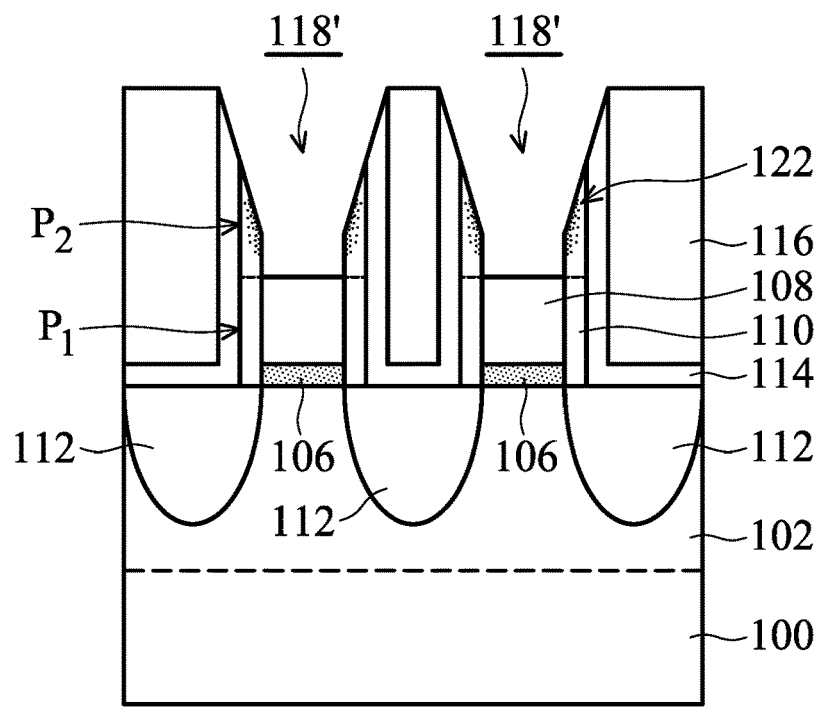

Afterwards, the oxide layers 120 are removed, as shown in FIG. 1F in accordance with some embodiments. A cleaning operation may be used to remove the oxide layers 120. For example, a dilute hydrofluoric acid (DHF) is used for removing the oxide layers 120.

Figure 1G:
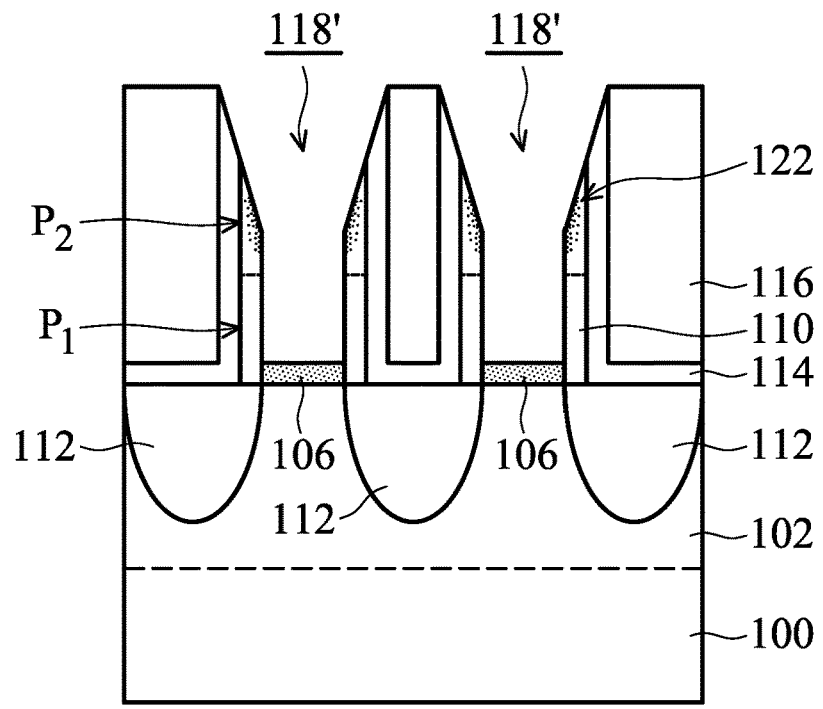

As shown in FIG. 1G, the remaining portions of the dummy gate electrodes 108 are removed to expose the dummy gate dielectric layer 106, in accordance with some embodiments. In some embodiments, the remaining portions of the dummy gate electrodes 108 are removed using a third etching operation. In some embodiments, an etching rate of the second etching operation to the spacer elements 110 is higher than an etching rate of the third etching operation to the spacer elements 110. In some embodiments, the spacer elements 110 are substantially not removed during the third etching operation.

In some embodiments, the third etching operation involves using plasma. In some embodiments, the reaction gas used in the third etching operation includes HBr, $Cl_2$, another similar gas, one or more other suitable gases, or a combination thereof. In some other embodiments, one or more other etching operations are performed before, during, between, and/or after the first, the second, and the third etching operations.

Figure 1H:
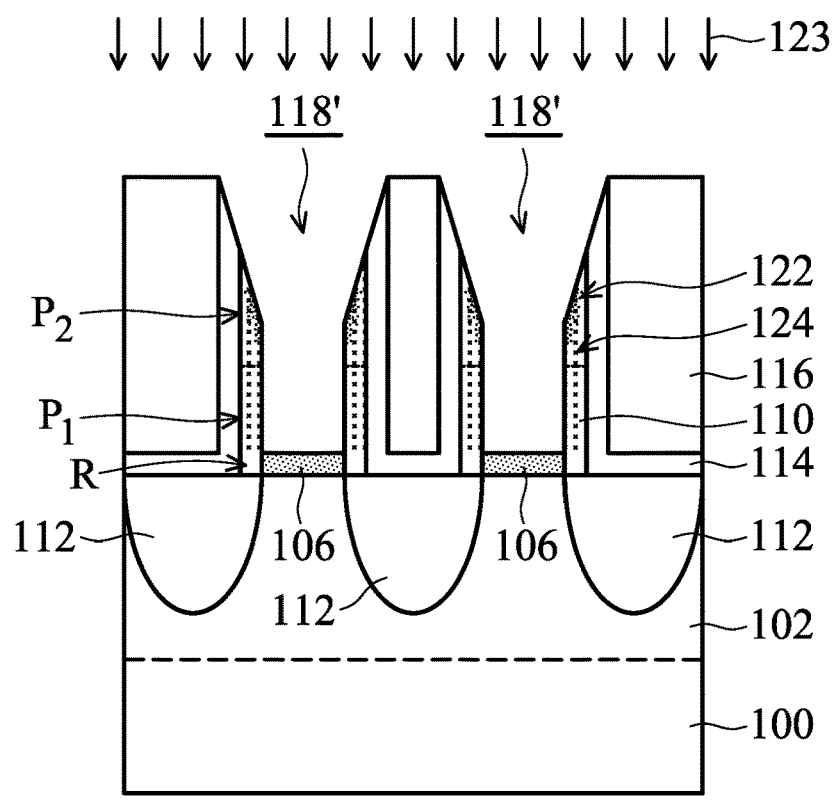

As shown in FIG. 1H, a doping operation 123 is used to dope the spacer elements 110 with one or more kinds of dopants, in accordance with some embodiments. The dopants are used to reduce the dielectric constant of the spacer elements so as to reduce the RC delay. After the doping operation 123, both the lower portion $P_1$ and the upper portion $P_2$ of the spacer elements 110 are doped with dopants 124.

In accordance with some embodiments of the disclosure, the spacer elements 110 are doped with the dopants 124 after the formation of the source/drain structures 112. Before the doping operation 123, the spacer elements 110 may have a strong resistance to sustain the process for forming the source/drain structures 112. For example, the spacer elements 110 may protect the gate stacks 104 from being damaged during the etching process for forming the recesses where the source/drain structures 112 are subsequently formed. After the formation of the source/drain structures 112, the doping operation is carried out to reduce the dielectric constant of the spacer elements 110. Therefore, the RC delay is reduced, and the reliability and performance of the semiconductor device structure are improved.

In some embodiments, the doping operation 123 is an ion-implantation process. In some embodiments, the spacer elements 110 are doped with a halide-containing dopant. In some embodiments, the spacer elements 110 are doped with fluorine. In some embodiments, the implanted composition includes radicals generated from F, $SiF_3$, $XeF_2$, $SF_6$, $SiF_4$, $Si_2F_6$, $SiF_2$, one or more other halide-containing source, or a combination thereof. The ion-implantation process may be carried out using an implantation dosage that is in a range from about $10^{13}$ ions/cm$^2$ to about $10^{15}$ ions/cm$^2$. The ion-implantation process may be carried out using at an implantation energy level that is in a range from about 0.1 KeV to about 20 KeV. The implantation energy level may be varied depending on the implanted species.

Many variations and/or modifications can be made to embodiments of the disclosure. Dopants other than the halide-containing dopants may also be used. In some embodiments, the dopants implanted into the spacer elements 110 include fluorine, nitrogen, oxygen, carbon, one or more other suitable dopants, or a combination thereof.

In some embodiments, the atomic concentration of the dopants 124 (such as fluorine) gradually decreases along a direction from an inner surface of the spacer element 110 towards an outer surface of the spacer element 110 that is adjacent to the etch stop layer 114. Since the dopants 124 enter the spacer element 110 from the inner surface of the spacer element 110 (i.e., the sidewall of the recess 118'), the portion of the spacer element 110 adjacent to the inner surface may have a greater atomic concentration of the dopants 124 than the portion of the spacer element 110 adjacent to the outer surface.

In some embodiments, due to the blocking of the dummy gate dielectric layer 106, a portion of the spacer elements 110 adjacent to the dummy gate dielectric layer 106 (such as the portion R) has a lower dopant concentration that other portions directly exposed to the doping operation 123. In some embodiments, the portion R of the spacer elements 110 adjacent to the dummy gate dielectric layer 106 is substantially free of the dopants 124, as shown in FIG. 1H.

However, embodiments of the disclosure are not limited thereto. Some dopants may diffuse downward to the portions blocked by the dummy gate dielectric layer 106. In some embodiments, the entirety of the spacer elements 110 has a substantially uniform dopant concentration.

Figure 1I:
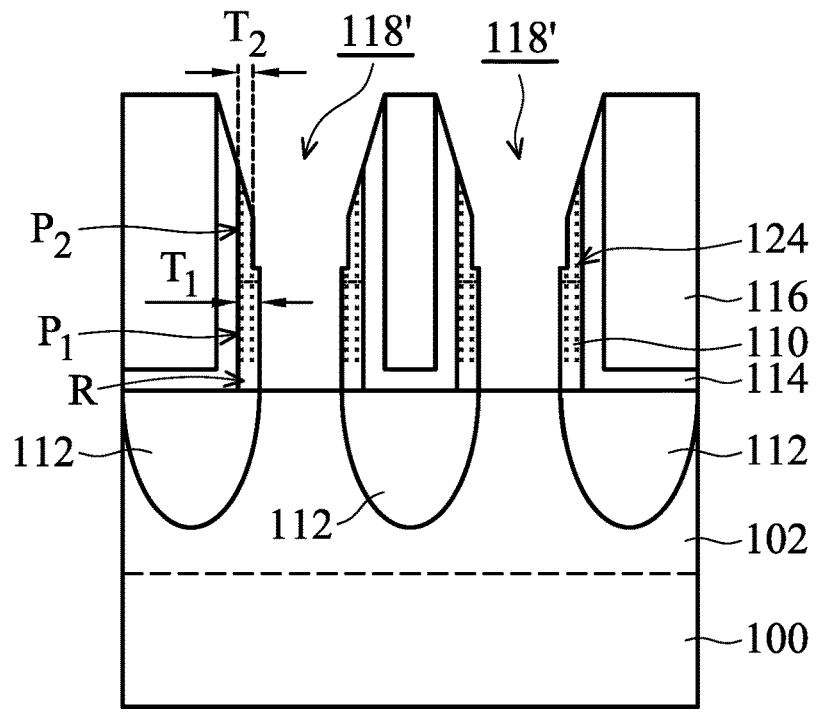

As shown in FIG. 1I, the dummy gate dielectric layer 106 is removed, in accordance with some embodiments. As a result, the fin structure 102 is partially exposed. In some embodiments, the dummy gate dielectric layer 106 is removed using an etching process. In some embodiments, due to the defects 122 in the upper portions $P_2$ of the spacer elements 110, the upper portions $P_2$ has a weaker resistance to the etchant used for removing the dummy gate dielectric layer 106 than the lower portions $P_1$. In some embodiments, the upper portions $P_2$ of the spacer elements 110 are partially removed while the dummy gate dielectric layer 106 is etched. As a result, each of the upper portions $P_2$ of the spacer elements 110 becomes thinner than lower portion $P_1$ thereunder, as shown in FIG. 1I. The etched part of the upper portions $P_2$ may have a greater atomic concentration of the dopants 124 than the remaining part of the upper portions $P_2$.

As shown in FIG. 1I, one of the lower portions $P_1$ has a thickness $T_1$, and one of the upper portions $P_2$ has a thickness $T_2$. In some embodiments, the thickness $T_1$ is greater than the thickness $T_2$. The thickness $T_1$ may be in a range from about 1 nm to about 20 nm. In some other embodiments, the thickness $T_1$ is in a range from about 3 nm to about 20 nm. The thickness $T_2$ may be in a range from about 1 nm to about 20 nm. In some other embodiments, the thickness $T_2$ is in a range from about 2.5 nm to about 19.5 nm.

In some embodiments, the lower portion $P_1$ of the spacer element 110 has a first atomic concentration of the dopants 124 (such as fluorine), and the upper portion $P_2$ of the spacer element 110 has a second atomic concentration of the dopants 124 (such as fluorine). In some embodiments, the first atomic concentration of the dopants 124 is greater than the second atomic concentration of the dopants 124.

Figure 1J:
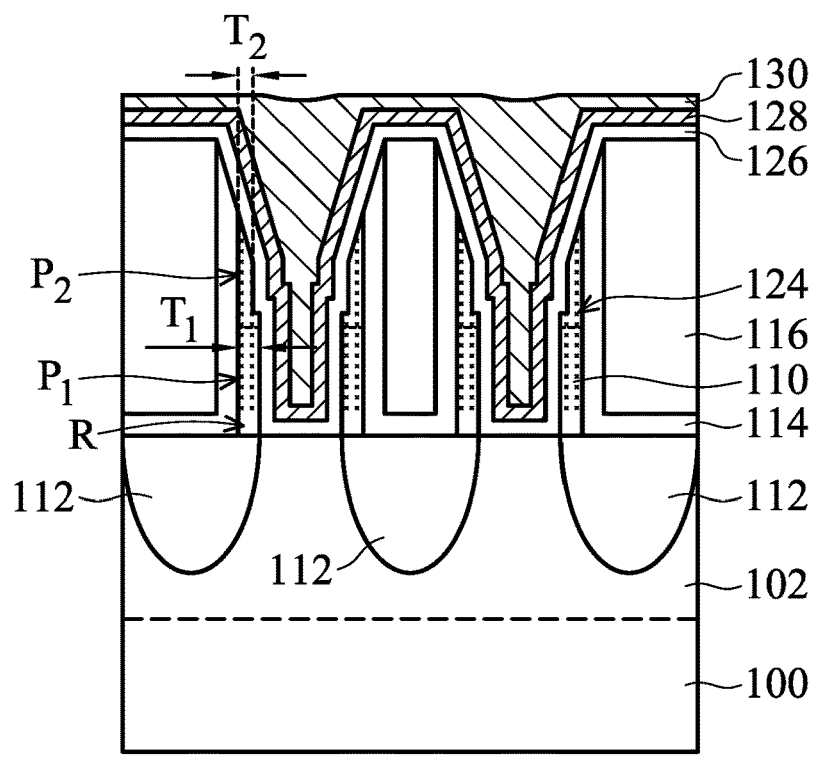

As shown in FIG. 1J, metal gate stack layers are deposited to fill the recesses 118' surrounded by the spacer elements 110, in accordance with some embodiments. The metal gate stack layers may include a gate dielectric layer 126, a work function layer 128, and a conductive filling layer 130. One or more other layers may be formed between the metal gate stack layers. For example, a barrier layer is formed between the gate dielectric layer 126 and the work function layer 128. A blocking layer may be formed between the work function layer 128 and the conductive filling layer 130. In some embodiments, the filling of the metal gate stack layers becomes easier since the recesses 118' are enlarged and/or widened.

In some embodiments, the gate dielectric layer 126 is made of or includes a dielectric material with high dielectric constant (high-K). The gate dielectric layer 126 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof.

In some embodiments, the gate dielectric layer 126 deposited over the dielectric layer 116 extends along the sidewalls and bottoms of the recesses 118'. The gate dielectric layer 126 may be deposited using an ALD process, a CVD process, one or more other applicable processes, or a combination thereof. In some embodiments, the formation of the gate dielectric layer 126 involves a thermal operation. During the thermal operation, the spacer elements 110 are also heated. The dopants 124 implanted in the spacer elements 110 may therefore be activated so that the dielectric constant of the spacer elements 110 is further reduced. Other subsequent thermal operations may also help to activate the dopants 124 in the spacer elements 110.

The work function layer 128 may be used to provide the desired work function for transistors to enhance device performance including improved threshold voltage. In some embodiments, the work function layer 128 is used for forming an NMOS device. The work function layer 128 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 128 is used for forming a PMOS device. The work function layer 128 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 128 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 128 may be fine-tuned to adjust the work function level. For example, a titanium nitride layer may be used as a p-type work function layer or an n-type work function layer, depending on the thickness and/or the compositions of the titanium nitride layer.

The work function layer 128 may be deposited over the gate dielectric layer 126 using an ALD process, a CVD process, a PVD process, an electroplating process, an electroless plating process, one or more other applicable processes, or a combination thereof.

In some embodiments, a barrier layer is formed before the work function layer 128 to interface the gate dielectric layer 126 with subsequently formed work function layer 128. The barrier layer may also be used to prevent diffusion between the gate dielectric layer 126 and the subsequently formed work function layer 128. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling layer 130 is made of or includes a metal material. The metal material may include tungsten, aluminum, copper, cobalt, one or more other suitable materials, or a combination thereof. The conductive filling layer 130 may be deposited over the work function layer 128 using a CVD process, an ALD process, a PVD process, an electroplating process, an electroless plating process, a spin coating process, one or more other applicable processes, or a combination thereof.

In some embodiments, a blocking layer is formed over the work function layer 128 before the formation of the conductive filling layer 130. The blocking layer may be used to prevent the subsequently formed conductive filling layer 130 from diffusing or penetrating into the work function layer 128. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Figure 1K:
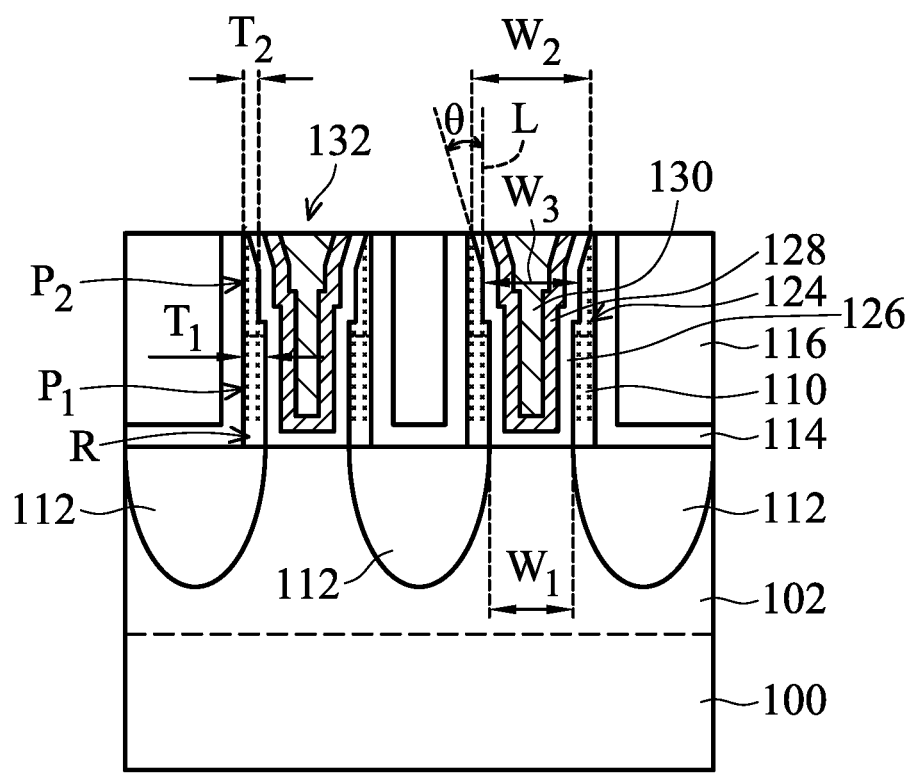

As shown in FIG. 1K, a planarization process is performed to remove the portions of the metal gate stack layers outside of the recesses (or trench) between the spacer elements 110, in accordance with some embodiments. As a result, metal gate stacks 132 are formed. Each of the metal gate stacks 132 includes the gate dielectric layer 126, the work function layer 128, and the conductive filling layer 130.

As shown in FIG. 1K, one of the metal gate stacks 132 has a lower portion with a width $W_1$, a mediate portion with a width $W_3$, and an upper portion with a width $W_2$. In some embodiments, the width $W_2$ is greater than the width $W_3$, and the width $W_3$ is greater than the width $W_1$.

As shown in FIG. 1K, an angle θ is formed between a sidewall surface of the spacer element 110 and an imaginary plane L extending from the inner surface of the spacer element 110 towards the top of the metal gate stack 132. In some embodiments, the angle θ should be carefully controlled to be within a suitable range. In some embodiments, the angle θ is in a range from about 0.5 degrees to about 20 degrees.

The upper portion $P_2$ of the spacer element 110 may have a lower part and an upper part. In some embodiments, the lower part has a substantially uniform thickness such as the thickness $T_2$, as shown in FIG. 1K. In some embodiments, the upper part gradually becomes thinner along a direction towards the top of the spacer element 110, as shown in FIG. 1K.

Figure 4:
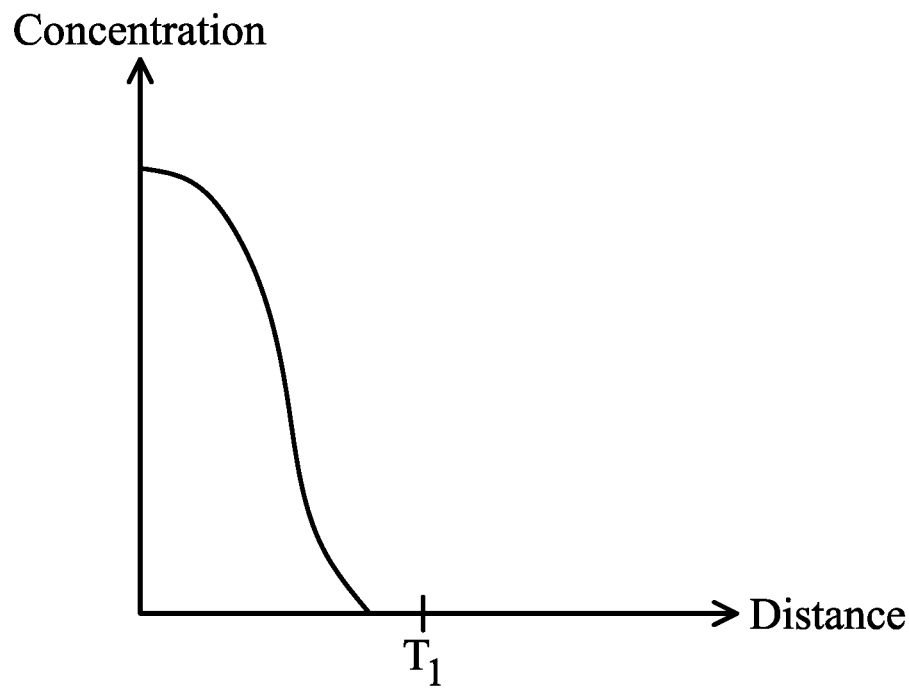
FIG. 4 is a graph showing the distribution of dopant concentration in a spacer element of a semiconductor device structure, in accordance with some embodiments.

FIG. 4 is a graph showing the distribution of dopant concentration in a spacer element of a semiconductor device structure, in accordance with some embodiments. In some embodiments, FIG. 4 shows the distribution of the atomic concentration of the dopants 124 in the spacer element 110 shown in FIG. 1K. The horizontal axis represents the distance going from the inner surface of the spacer element 110 (adjacent to the metal gate stack 132) to the outer surface of the spacer element 110 (adjacent to the etch stop layer 114 and at the distance $T_1$). The vertical axis represents the atomic concentration of the dopants 124 in the spacer element 110 at the corresponding distance. As illustrated in FIGS. 4 and 1K, the atomic concentration of the dopants 124 in the spacer element 110 gradually decreases along a direction from the inner surface of the spacer element 110 towards the outer surface of the spacer element 110. In some embodiments, a portion of the spacer element 110 adjacent to the outer surface of the spacer element 110 is substantially free of the dopants 124.

Figure 5:
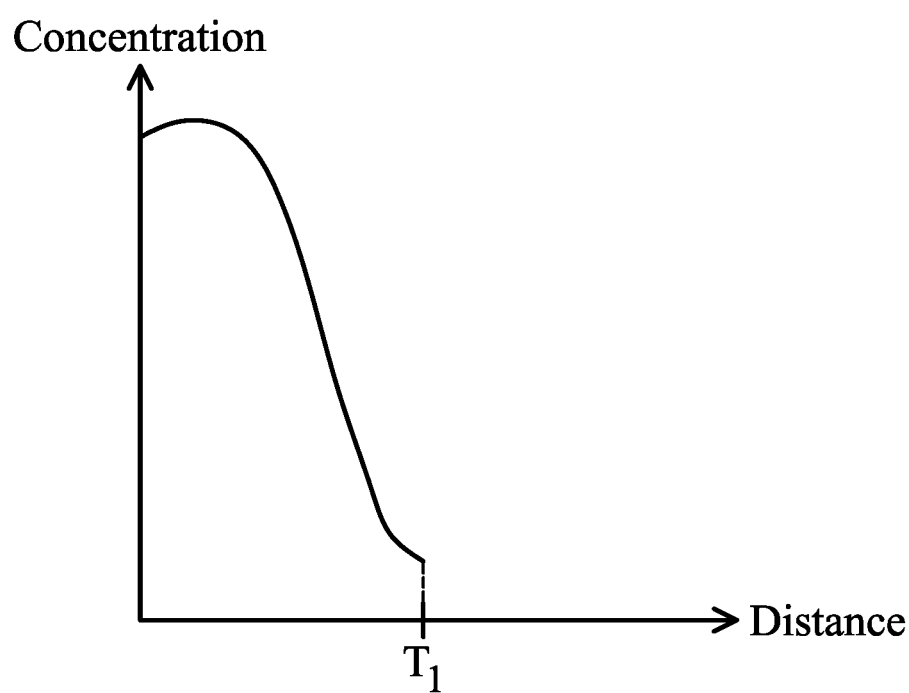
FIG. 5 is a graph showing the distribution of dopant concentration in a spacer element of a semiconductor device structure, in accordance with some embodiments.

FIG. 5 is a graph showing the distribution of dopant concentration in a spacer element of a semiconductor device structure, in accordance with some embodiments. In some embodiments, FIG. 5 shows the distribution of the atomic concentration of the dopants 124 in the spacer element 110 shown in FIG. 1K. As illustrated in FIGS. 5 and 1K, the atomic concentration of the dopants 124 in the spacer element 110 gradually decreases along a direction from the inner surface of the spacer element 110 towards the outer surface of the spacer element 110. In some embodiments, the portion of the spacer element 110 adjacent to the inner surface of the spacer element 110 has a higher atomic concentration of the dopants 124 than the portion of the spacer element 110 adjacent to the outer surface of the spacer element 110.

Figure 2:
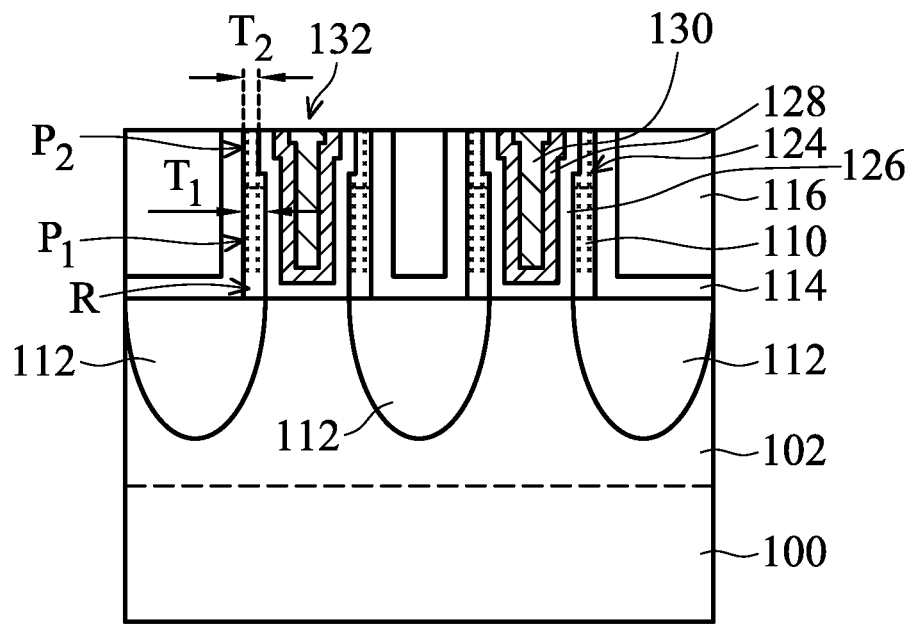
FIG. 2 is a cross-sectional view of a semiconductor device structure, in accordance with some embodiments.

Many variations and/or modifications can be made to embodiments of the disclosure. FIG. 2 is a cross-sectional view of a semiconductor device structure, in accordance with some embodiments. In some embodiments, the planarization process for forming the metal gate stacks 132 further removes the upper part of the upper portion $P_2$ of the spacer element 110. As a result, the structure shown in FIG. 2 is formed.

Figure 3:
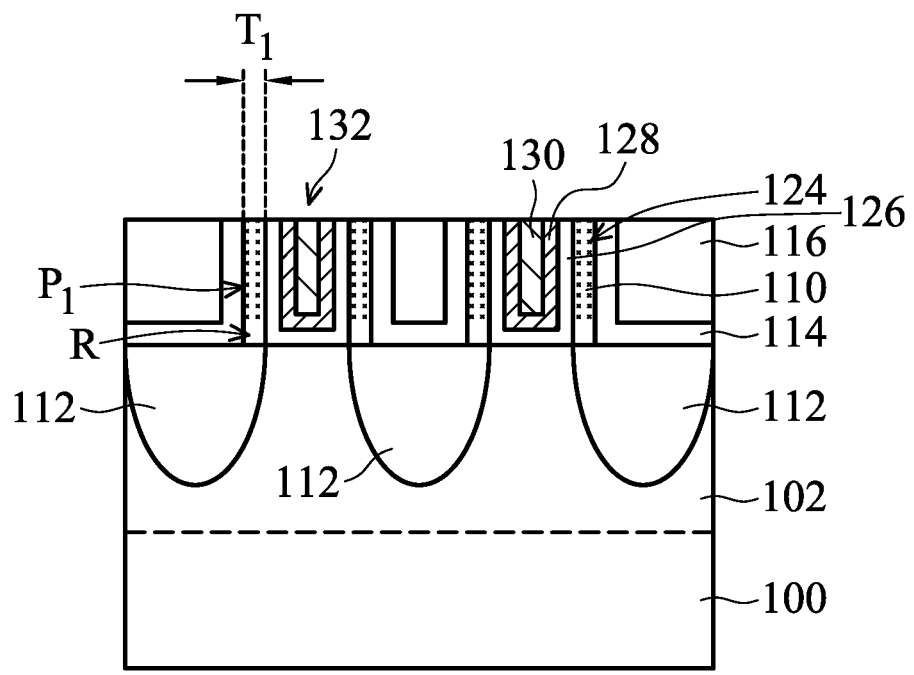
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, the planarization process for forming the metal gate stacks 132 further removes the upper portion $P_2$ of the spacer element 110. As a result, the structure shown in FIG. 3 is formed.

Embodiments of the disclosure relate to a gate replacement process. A dummy gate stack having a dummy gate electrode and a dummy gate dielectric layer is partially removed to form a recess between spacer elements. The spacer elements are then partially removed to have a wider upper portion, which facilitates the subsequent formation of a metal gate stack. Afterwards, the dummy gate electrode is removed to expose the dummy gate dielectric layer. A doping operation is then used to dope the spacer elements with one or more kinds of dopants capable of reducing the dielectric constant of the spacer elements. Afterwards, the dummy gate dielectric layer is removed, and a metal gate stack is formed in the recess. Before the doping operation, the spacer elements may have a strong resistance to sustain the process for forming source/drain structures beside the dummy gate stack. After the formation of the source/drain structures, the doping operation is carried out to reduce the dielectric constant of the spacer elements. Therefore, the RC delay is reduced, and the reliability and performance of the semiconductor device structure are improved.

In accordance with some embodiments, a method for forming a semiconductor device structure is provided. The method includes forming a dummy gate stack over a semiconductor substrate. The dummy gate stack has a dummy gate electrode and a dummy gate dielectric layer. The method also includes forming spacer elements over sidewalls of the dummy gate stack and partially removing the dummy gate electrode to form a recess. The method further includes partially removing the spacer elements to enlarge the recess and removing a remaining portion of the dummy gate electrode to expose the dummy gate dielectric layer. In addition, the method includes doping the spacer elements after the remaining portion of the dummy gate electrode is removed and removing the dummy gate dielectric layer. The method further includes forming a metal gate stack in the recess.

In accordance with some embodiments, a method for forming a semiconductor device structure is provided. The method includes forming a dummy gate electrode over a semiconductor structure and forming spacer elements over sidewalls of the dummy gate electrode. The method also includes partially removing the dummy gate electrode to form a recess and partially removing the spacer elements such that an upper portion of the recess becomes wider. The method further includes removing a remaining portion of the dummy gate electrode and implanting the spacer elements with at least one kind of dopant. In addition, the method includes forming a metal gate stack in the recess.

In accordance with some embodiments, a semiconductor device structure is provided. The semiconductor device structure includes a semiconductor substrate and a metal gate stack over the semiconductor substrate. The semiconductor device structure also includes a spacer element over a sidewall of the metal gate stack. The spacer element is doped with fluorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dummy gate stack over a semiconductor substrate, wherein the dummy gate stack has a dummy gate electrode and a dummy gate dielectric layer;
    forming spacer elements over sidewalls of the dummy gate stack;
    partially removing the dummy gate electrode to form a recess;
    partially removing the spacer elements to enlarge the recess;
    removing a remaining portion of the dummy gate electrode to expose the dummy gate dielectric layer;
    doping the spacer elements after the remaining portion of the dummy gate electrode is removed;
    removing the dummy gate dielectric layer, wherein the dummy gate dielectric layer is removed after doping the spacer elements; and
    forming a metal gate stack in the recess.

2. The method for forming a semiconductor device structure as claimed in claim 1, wherein doping the spacer elements comprises ion-implanting the spacer elements with a halide-containing dopant.

3. The method for forming a semiconductor device structure as claimed in claim 1, wherein the spacer elements are doped with fluorine.

4. The method for forming a semiconductor device structure as claimed in claim 1, wherein an upper portion of the spacer elements is partially removed while the dummy gate dielectric layer is removed such that the upper portion of the spacer elements becomes thinner than a lower portion of the spacer elements.

5. The method for forming a semiconductor device structure as claimed in claim 1, further comprising:
    forming a source/drain structure over the semiconductor substrate, wherein the source/drain structure is beside the dummy gate stack;
    forming a dielectric layer over the source/drain structure and the dummy gate stack; and
    planarizing the dielectric layer to expose the dummy gate stack.

6. The method for forming a semiconductor device structure as claimed in claim 5, further comprising an etch stop layer over the source/drain structure and the dummy gate stack before the dielectric layer is formed.

7. The method for forming a semiconductor device structure as claimed in claim 6, wherein a portion of the etch stop layer is removed during the partial removal of the spacer elements to enlarge the recess.

8. The method for forming a semiconductor device structure as claimed in claim 5, wherein forming the metal gate stack comprises:
    forming a gate dielectric layer over the dielectric layer, wherein the gate dielectric layer extends along sidewalls and a bottom of the recess;
    forming a work function layer over the gate dielectric layer;
    forming a conductive filling layer over the work function layer to fill the recess; and
    planarizing the conductive filling layer, the work function layer, and the gate dielectric layer to expose the dielectric layer.

9. The method for forming a semiconductor device structure as claimed in claim 1, further comprising heating the spacer elements after the spacer elements are doped.

10. The method for forming a semiconductor device structure as claimed in claim 1, wherein an upper portion of the spacer elements has a first dopant concentration, a lower portion of the spacer elements has a second dopant concentration, and the first dopant concentration is greater than the second dopant concentration.

11. A method for forming a semiconductor device structure, comprising:
    forming a dummy gate electrode over a semiconductor structure;
    forming spacer elements over sidewalls of the dummy gate electrode;
    partially removing the dummy gate electrode to form a recess;
    partially removing the spacer elements such that an upper portion of the recess becomes wider;
    removing a remaining portion of the dummy gate electrode, wherein a dummy gate dielectric layer is exposed after the remaining portion of the dummy gate electrode is removed;
    implanting the spacer elements with at least one kind of dopant;
    forming a metal gate stack in the recess; and
    removing the dummy gate dielectric layer after implanting the spacer elements and before forming the metal gate stack.

12. The method for forming a semiconductor device structure as claimed in claim 11, wherein the at least one kind of dopant comprises fluorine, nitrogen, oxygen, carbon, or a combination thereof.

13. The method for forming a semiconductor device structure as claimed in claim 11, further comprising forming a source/drain structure beside the dummy gate electrode before implanting the spacer elements.

14. The method for forming a semiconductor device structure as claimed in claim 11, further comprising removing a native oxide grown on the dummy gate electrode after partially removing the spacer elements and before removing the remaining portion of the dummy gate electrode.

15. The method for forming a semiconductor device structure as claimed in claim 11, wherein an upper portion of the spacer elements has a first dopant concentration, a lower portion of the spacer elements has a second dopant concentration, and the first dopant concentration is greater than the second dopant concentration.

16. The method for forming a semiconductor device structure as claimed in claim 15, wherein the lower portion of the spacer elements is substantially free of the at least one kind of dopant.

17. A method for forming a semiconductor device structure, comprising:
    forming a dummy gate electrode over a semiconductor structure;
    forming spacer elements over sidewalls of the dummy gate electrode;
    removing an upper portion of the dummy gate electrode to form a recess;
    removing upper portions of the spacer elements;
    removing a remaining portion of the dummy gate electrode after the upper portions of the spacer elements are removed, wherein a dummy gate dielectric layer is exposed after the remaining portion of the dummy gate electrode is removed;
    introducing at least one kind of dopant into the spacer elements;
    forming a metal gate stack in the recess; and
    removing the dummy gate dielectric layer after introducing the at least one kind of dopant into the spacer elements and before forming the metal gate stack.

18. The method for forming a semiconductor device structure as claimed in claim 17, wherein the at least one kind of dopant reduces a dielectric constant of the spacer elements.

19. The method for forming a semiconductor device structure as claimed in claim 17, wherein the at least one kind of dopant comprises fluorine, nitrogen, oxygen, carbon, or a combination thereof.

20. The method for forming a semiconductor device structure as claimed in claim 17, wherein the upper portions of the spacer elements are partially removed while the dummy gate dielectric layer is removed such that each of the upper portions of the spacer elements becomes thinner than each of lower portions of the spacer elements.

\* \* \* \* \*